United States Patent
Nakagai et al.

(10) Patent No.: US 12,139,643 B2
(45) Date of Patent: Nov. 12, 2024

(54) POLISHING COMPOSITION

(71) Applicant: FUJIMI INCORPORATED, Aichi (JP)

(72) Inventors: Yuichiro Nakagai, Aichi (JP); Yasuaki Ito, Aichi (JP); Hiroyuki Oda, Aichi (JP); Shogaku Ide, Aichi (JP); Shinichiro Takami, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 0 days.

(21) Appl. No.: 18/529,763

(22) Filed: Dec. 5, 2023

(65) Prior Publication Data
US 2024/0110080 A1    Apr. 4, 2024

Related U.S. Application Data

(63) Continuation of application No. 18/275,266, filed as application No. PCT/JP2022/004020 on Feb. 2, 2022.

(30) Foreign Application Priority Data

Feb. 4, 2021    (JP) ................ 2021-016870

(51) Int. Cl.
*C09G 1/02* (2006.01)
*B24B 37/04* (2012.01)
*H01L 21/02* (2006.01)

(52) U.S. Cl.
CPC .............. *C09G 1/02* (2013.01); *B24B 37/044* (2013.01); *H01L 21/02013* (2013.01)

(58) Field of Classification Search
None
See application file for complete search history.

(56) References Cited

U.S. PATENT DOCUMENTS

| | | |
|---|---|---|
| 2017/0088748 A1 | 3/2017 | Matthias et al. |
| 2017/0321098 A1* | 11/2017 | Takahashi ............. H01L 21/304 |
| 2018/0340095 A1* | 11/2018 | Ward ................ H01L 21/30625 |
| 2019/0062598 A1 | 2/2019 | Matthias et al. |
| 2020/0109313 A1 | 4/2020 | Ito et al. |
| 2020/0332163 A1 | 10/2020 | Matsuo et al. |
| 2020/0399505 A1 | 12/2020 | Ito et al. |
| 2022/0089911 A1 | 3/2022 | Ito et al. |

FOREIGN PATENT DOCUMENTS

| | | |
|---|---|---|
| JP | 2017105980 A | 6/2017 |
| JP | 2020527612 A | 9/2020 |
| WO | 2018174008 A1 | 3/2018 |
| WO | 2018217978 A1 | 11/2018 |
| WO | 2019138846 A1 | 7/2019 |
| WO | 2019188901 A1 | 10/2019 |
| WO | 2020087721 A1 | 5/2020 |

OTHER PUBLICATIONS

International Preliminary Report on Patentability of PCT Application No. PCT/JP2022/004020 with a mailing date of Aug. 17, 2023.

* cited by examiner

*Primary Examiner* — Roberts P Culbert
(74) *Attorney, Agent, or Firm* — Katten Muchin Rosenman LLP

(57) ABSTRACT

Provided is a polishing composition containing an abrasive, permanganate, an aluminum salt, and water. In the polishing composition, a relation of a content W1 [% by weight] of the abrasive, a concentration C1 [mM] of the permanganate, and a concentration C2 [mM] of the aluminum salt satisfies at least one condition of the following conditions [A], [B], and [C]:

| | |
|---|---|
| satisfying both of $500 \leq (C1/W1)$ and $0.04 \leq (C2/C1)$; | [A] |
| satisfying both of $200 \leq (C1/\sqrt{(W1)})$ and $8 \leq C2$; and | [B] |
| satisfying both of $500 \leq (C1/W1)$ and $8 \leq C2$. | [C] |

13 Claims, No Drawings

POLISHING COMPOSITION

CROSS-REFERENCE TO RELATED APPLICATIONS

The application is a continuation of U.S. patent application Ser. No. 18/275,266, filed on Aug. 1, 2023, which claims priority to International Patent Application No. PCT/JP2022/004020, filed Feb. 2, 2022, which claims foreign priority to Japanese Patent Application No. 2021-016870, filed on Feb. 4, 2021, the entire contents of which applications are hereby incorporated by reference in their entireties.

TECHNICAL FIELD

The present invention relates to a polishing composition.

BACKGROUND ART

A surface of a material such as metal, semimetal, nonmetal, or an oxide thereof has been polished with a polishing composition. For example, a surface made of a compound semiconductor material, such as silicon carbide, boron carbide, tungsten carbide, silicon nitride, titanium nitride, or gallium nitride is processed by polishing (lapping), which is performed by supplying a diamond abrasive (abrasive particles) between the surface and a polishing platen. However, lapping with a diamond abrasive is prone to generate defects and strains due to generated or remaining scratches or dents, or the like. For this reason, exploration has been made for polishing with a polishing pad and a polishing composition, after lapping with a diamond abrasive or instead of such lapping. Examples of literatures disclosing this kind of conventional technologies include Patent Literatures 1 and 2.

CITATION LIST

Patent Literature

[Patent Literature 1] Japanese Patent Application Publication No. 2020-527612
[Patent Literature 2] WO2020/087721

SUMMARY OF INVENTION

Technical Problem

Generally, a polishing removal rate is required to be practically, sufficiently high in view of manufacturing efficiency, cost-effectiveness, and the like. For example, polishing of a surface made of a high hardness material such as silicon carbide has strongly required an improved polishing removal rate. To deal with this matter, a polishing material containing a strong oxidant such as permanganate has conventionally been used, but a problem has been that the material is autolyzed during storage due to its high activity and thus less likely to provide a desired polishing removal rate.

Furthermore, Patent Literature 1 discloses a fluid composition containing at least one oxidant and a polyvalent cationic component. The description shows that use of such a fluid composition in a chemical mechanical polishing (CMP) process can achieve a suitable material removal rate as well as provide a material surface with relatively less defects (paragraph[0005]). In the disclosure in Patent Document 1, one characteristic is that the fluid composition needs no polishing particle (polishing agent) (paragraph[0005]), and a composition containing no polishing agent is mainly investigated in spite of the description indicating that a polishing agent may be added (paragraph[0040]). However, for the purpose of improving productivity or the like of a product provided via polishing (substrate, etc.), there has still been demand for improving a polishing removal rate in a polishing composition containing an abrasive.

It should be noted that a polishing removal rate can be improved by setting of polishing conditions such as increasing a load on a surface to be polished in polishing to gain a processing pressure, or speeding up platen rotation of a polishing machine. Meanwhile, in use of a polishing composition containing an abrasive, selection of its composition to improve a polishing removal rate tends to lead to larger increase in temperature of a polishing pad during polishing with the polishing composition. In use of a polishing composition containing an abrasive, reduction of increase in temperature of a polishing pad allows employing more severe processing conditions, thus bringing about benefit for further improving a polishing removal rate. Furthermore, Patent Document 2 relates to a chemical mechanical polishing slurry having improved pH stability, but does not have an objective to combine such stability with a plurality of polishing practical capacities such as a polishing removal rate.

The present invention was made in light of such circumstances, and has an objective to provide a polishing composition that can combine a high polishing removal rate and reduction of increase in temperature of a polishing pad during polishing. Another related object is to provide a polishing method of an object to be polished using such a polishing composition.

Solution to Problem

The specification provides a polishing composition containing an abrasive (abrasive particles), permanganate, an aluminum salt, and water, wherein a relation of a content W1 [% by weight] of the abrasive, a concentration C1 [mM] of the permanganate, and a concentration C2 [mM] of the aluminum salt satisfies both of the following formulae (1) and (2):

$$500 \leq (C1/W1) \tag{1}$$

$$0.04 \leq (C2/C1) \tag{2}$$

The polishing composition having such composition allows preferably combining improvement in a polishing removal rate, and reduction of increase in polishing pad temperature (hereinafter referred to as pad temperature) during polishing.

Note that in the formulae (1) and (2), "W1" represents a numerical value part in indication of the content of an abrasive in the polishing composition by a unit "% by weight"; "C1" represents a numerical value part in indication of the concentration of permanganate in the polishing composition by a unit "mM"; "C2" represents a numerical value part in indication of the concentration of an aluminum salt in the polishing composition by a unit "mM"; and all of W1, C1, and C2 are dimensionless numbers.

In some preferred embodiments of the art disclosed herein (encompassing polishing compositions, polishing methods, production methods of a polished object, etc., with the same applying hereinafter), the concentration of the aluminum salt C2 [mM] is 8 mM or more, e.g., 8 mM or more to 1000 mM or less. Setting the concentration of the aluminum salt in the polishing composition is 8 mM or more can achieve longer-term preservation stability (shelf life).

In some embodiments, the content W1 of the abrasive is 0.005% by weight or more to less than 0.5% by weight. In such a range of the content of the abrasive, an effect to combine and balance improvement in a polishing removal rate and reduction of increase in pad temperature can be preferably exerted.

In some embodiments, the pH of the polishing composition is 5.0 or less. In the polishing composition with such a pH, it is particularly effective to apply the art disclosed herein to combine improvement in a polishing removal rate and reduction of increase in pad temperature.

The polishing composition disclosed herein is used for, e.g., polishing a material having a Vickers hardness of 1500 Hv or more. In polishing of such a high hardness material, an effect caused by the art disclosed herein can be preferably exerted. In some embodiments, the material having a Vickers hardness of 1500 Hv or more is non-oxide (i.e., a compound that is not an oxide). In polishing of a non-oxide material to be polished, effects to improve a polishing removal rate and to reduce increase in pad temperature by the polishing composition disclosed herein can be preferably combined.

The polishing composition disclosed herein is used for, e.g., polishing of silicon carbide. In polishing of silicon carbide, an effect caused by the art disclosed herein can be preferably exerted.

The specification further provides a polishing method of an object to be polished. The polishing method includes a step of polishing an object to be polished using any of the polishing compositions disclosed herein. Such a polishing method can reduce increase in pad temperature as well as gain a polishing removal rate, even in polishing an object to be polished that is formed of a high hardness material. This can improve productivity of an object derived via polishing with the polishing method (a polished object, e.g., a compound semiconductor substrate such as a silicon carbide substrate).

The specification also provides a polishing composition containing an abrasive (abrasive particles), permanganate, an aluminum salt, and water, wherein a relation of a content W1 [% by weight] of the abrasive, a concentration C1 [mM] of the permanganate, and a concentration C2 [mM] of the aluminum salt satisfies both of the following formulae (3) and (4).

$$200 \leq (C1/\sqrt{(W1)}) \tag{3}$$

$$8 \leq C2 \tag{4}$$

The polishing composition having such composition allows reducing increase in pad temperature as well as gaining a polishing removal rate, and improving preservation stability (shelf life).

Note in that the formulae (3) and (4), "W1" represents a numerical value part in indication of the content of abrasive in the polishing composition by a unit "% by weight"; "C1" represents a numerical value part in indication of the concentration of permanganate in the polishing composition by a unit "mM"; "C2" represents a numerical value part in indication of the concentration of aluminum salt in the polishing composition by a unit "mM"; and all of W1, C1, and C2 are dimensionless numbers.

In some preferred embodiments of the art disclosed herein, a relation of the concentration C1 [mM] of the permanganate and the concentration C2 [mM] of the aluminum salt satisfies the following formula (5).

$$0.04 \leq (C2/C1) \tag{5}$$

The polishing composition having such composition can effectively reduce increase in pad temperature.

Note that in the formula (5), "C1" represents a numerical value part in indication of the concentration of permanganate in the polishing composition by a unit "mM"; "C2" represents a numerical value part in indication of the concentration of aluminum salt in the polishing composition by a unit "mM"; and C1 and C2 are dimensionless numbers.

In some embodiments, the content W1 of the abrasive is 0.005% by weight or more to less than 0.5% by weight. In such a range of the content of the abrasive, an effect to combine and balance improvement in a polishing removal rate and reduction of increase in pad temperature can be preferably exerted.

In some embodiments, the pH of the polishing composition is 5.0 or less. In the polishing composition with such a pH, it is particularly effective to apply the art disclosed herein to combine improvement in a polishing removal rate and reduction of increase in pad temperature.

The polishing composition disclosed herein is used for, e.g., polishing a material having a Vickers hardness of 1500 Hv or more. In polishing of such a high hardness material, an effect caused by the art disclosed herein can be preferably exerted. In some embodiments, the material having a Vickers hardness of 1500 Hv or more is non-oxide (i.e., a compound that is not an oxide). In polishing of a non-oxide material to be polished, effects to improve a polishing removal rate and to reduce increase in pad temperature by the polishing composition disclosed herein can be preferably exerted.

The polishing composition disclosed herein is used for, e.g., polishing of silicon carbide. In polishing of silicon carbide, an effect caused by the art disclosed herein can be preferably exerted.

The specification further provides a polishing method of an object to be polished. The polishing method includes a step of polishing an object to be polished using any of the polishing compositions disclosed herein. Such a polishing method can reduce increase in pad temperature as well as gain a polishing removal rate, even in polishing an object to be polished that is formed of a high hardness material. This can improve productivity of an object derived via polishing with the polishing method (a polished object, e.g., a compound semiconductor substrate such as a silicon carbide substrate).

Furthermore, the specification provides a polishing composition containing an abrasive (abrasive particles), permanganate, an aluminum salt, and water, wherein a relation of a content W1 [% by weight] of the abrasive, a concentration C1 [mM] of the permanganate, and a concentration C2 [mM] of the aluminum salt satisfies both of the following formulae (6) and (7).

$$500 \leq (C1/W1) \tag{6}$$

$$8 \leq C2 \tag{7}$$

The polishing composition having such composition allows reducing increase in pad temperature as well as gaining a polishing removal rate, and improving preservation stability (shelf life).

Note that in the formulae (6) and (7), "W1" represents a numerical value part in indication of the content of abrasive in the polishing composition by a unit "% by weight"; "C1" represents a numerical value part in indication of the concentration of permanganate in the polishing composition by a unit "mM"; "C2" represents a numerical value part in indication of the concentration of aluminum salt in the polishing composition by a unit "mM"; and all of W1, C1, and C2 are dimensionless numbers.

DESCRIPTION OF EMBODIMENTS

Preferred embodiments of the present invention will be described below. Matters that are other than those particularly mentioned herein but are necessary for implementation of the present invention can be recognized as matters to be designed by those skilled in the art based on conventional technologies in the art. The present invention can be implemented based on contents disclosed herein and common technical knowledge in the art.

<Polishing Composition>
(Abrasive)

The polishing composition disclosed herein contains an abrasive (or abrasive particles. The same applies hereinafter.). The polishing composition containing an abrasive can exert not only primarily chemical polishing action by permanganate and an aluminum salt but also primarily mechanical polishing action by an abrasive, thereby achieving a higher polishing removal rate. Furthermore, since inclusion of an abrasive in the polishing composition tends to lead to increase in pad temperature, it is more effective to apply the art disclosed herein to reduce increase in pad temperature.

The material, properties, and the like of the abrasive are not particularly limited. For example, the abrasive may be any of inorganic particles, organic particles, and organic-inorganic composite particles. Examples thereof include an abrasive substantially formed of any of the following: oxide particles such as silica particles, alumina particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate. The abrasive may be used as a single kind or in combination of two or more kinds thereof. In particular, preferred are oxide particles such as silica particles, alumina particles, cerium oxide particles, chromium oxide particles, zirconium oxide particles, manganese dioxide particles, and iron oxide particles, because of their ability to form a good surface. Specifically, more preferred are silica particles, alumina particles, zirconium oxide particles, chromium oxide particles, and iron oxide particles, and particularly preferred are silica particles and alumina particles. In an embodiment with use of silica particles or alumina particles as the abrasive, the art disclosed herein can be applied to preferably exert an effect to reduce increase in pad temperature.

Note that "substantially consisting of X" or "substantially formed of X" for composition of the abrasive herein means that the proportion of X in the abrasive (purity of X) is 90% or more by weight. The proportion of X in the abrasive is preferably 95% or more, more preferably 97% or more, even more preferably 98% or more, and e.g., 99% or more.

The average primary particle diameter of the abrasive is not particularly limited. In view of reducing increase in pad temperature as well as easily providing a desired polishing removal rate, the average primary particle diameter of the abrasive can be e.g., 5 nm or more, is suitably 10 nm or more, and preferably 20 nm or more, and may be 30 nm or more. In view of improving a polishing removal rate, the average primary particle diameter of the abrasive in some embodiments may be 50 nm or more, 80 nm or more, 150 nm or more, 250 nm or more, or 350 nm or more. Additionally, in view of reducing increase in pad temperature, the average primary particle diameter of the abrasive can be, e.g., 5 μm or less, preferably 3 μm or less, and more preferably 1 μm or less, and may be 750 nm or less, or 500 nm or less. In view of a surface quality or the like after polishing, the average primary particle diameter of the abrasive in some embodiments may be 350 nm or less, 300 nm or less, 180 nm or less, 150 nm or less, 85 nm or less, or 50 nm or less.

The average primary particle diameter as used herein refers to a particle diameter (BET particle diameter) calculated from a specific surface area measured by a BET method (BET value) by the formula: average primary particle diameter (nm)=6000/(true density (g/cm$^3$)×BET value (m$^2$/g)). The specific surface area can be measured using e.g., a surface area measurement device with the product name of "Flow Sorb II 2300", manufactured by Micromeritics Instrument Corporation.

The average secondary particle diameter of the abrasive may be e.g., 10 nm or more, and is, in view of facilitating enhancement of a polishing removal rate, preferably 50 nm or more, and more preferably 100 nm or more, and may be 250 nm or more, or 400 nm or more. The upper limit of the average secondary particle diameter of the abrasive is suitably approximately 10 inn or less in view of sufficiently ensuring the number per unit weight. Furthermore, in view of reducing increase in pad temperature, the average secondary particle diameter is preferably 5 μm or less, more preferably 3 μm or less, and e.g., 1 μm or less. In view of a surface quality or the like after polishing, the average secondary particle diameter of the abrasive in some embodiments may be 600 nm or less, 300 nm or less, 170 nm or less, or 100 nm or less.

The average secondary particle diameter of the abrasive can be measured, for particles having a size of less than 500 nm, as the volume average particle diameter (arithmetic average diameter by volume; Mv) by dynamic light scattering, using, e.g., model "UPA-UT151" manufactured by Nikkiso Co., Ltd. Particles having a size of 500 nm or more can be measured as the volume average particle diameter by an aperture electrical resistance method or the like using model "Multisizer 3" manufactured by Beckman Coulter Inc.

In use of alumina particles (an alumina abrasive) as the abrasive, the alumina particles can be appropriately selected and used from various known alumina particles. Examples of such known alumina particles include α-alumina and intermediate alumina. Intermediate alumina herein refers to a collective designation of alumina particles other than α-alumina, and specific examples include γ-alumina, δ-alumina, θ-alumina, η-alumina, κ-alumina, and χ-alumina. Alumina referred to as fumed alumina in accordance with classification by production methods (typically, alumina microparticles produced in high-temperature firing of alumina salt) may also be used. Furthermore, alumina referred to as colloidal alumina or alumina sol (e.g., alumina hydrate such as boehmite) is also included in examples of the known alumina particles. In view of processability, it is preferable to contain α-alumina. The alumina abrasive in the art disclosed herein can contain such alumina particles as a single one species or in combination of two or more kinds.

In use of alumina particles as the abrasive, it is generally advantageous that the proportion of the alumina particles in the total abrasive to be used be higher. For example, the proportion of the alumina particles in the total abrasive is preferably 70% by weight or more, more preferably 90% by weight or more, and yet more preferably 95% by weight or more, and may be substantially 100% by weight.

The particle size of the alumina abrasive is not particularly limited, and can be selected so as to exert a desired polishing effect. In view of improving a polishing removal rate, the average primary particle diameter of the alumina abrasive is preferably 50 nm or more, and more preferably 80 nm or more, and may be 150 nm or more, 250 nm or more, 300 nm or more, or 350 nm or more. The upper limit of the average primary particle diameter of the alumina abrasive is not particularly limited, but is, in view of reducing increase in pad temperature, suitably roughly 5 μm or less. In view of a surface quality after polishing, the upper limit is preferably 3 μm or less, and more preferably 1 μm or less, and may be 750 nm or less, 500 nm or less, 400 nm or less, or 350 nm or less.

In use of alumina particles as abrasive, the polishing composition disclosed herein may further contain an abrasive made of a material other than the alumina described above (hereinafter also referred to as a non-alumina abrasive) as far as an effect in the present invention is not impaired. Examples of such a non-alumina abrasive include an abrasive substantially formed of any of the following: oxide particles such as silica particles, cerium oxide particles, chromium oxide particles, titanium dioxide particles, zirconium oxide particles, magnesium oxide particles, manganese oxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate.

The content of the non-alumina abrasive is suitably, e.g., 30% by weight or less, preferably 20% by weight or less, and more preferably 10% by weight or less in the total weight of the abrasives contained in the polishing composition.

In a preferred embodiment in the art disclosed herein, the polishing composition contains silica particles (a silica abrasive) as the abrasive. The silica abrasive can be appropriately selected and used from various known silica particles. Examples of such known silica particles include colloidal silica and dry silica. In particular, use of colloidal silica is preferable. A silica abrasive containing colloidal silica can preferably achieve a good surface smoothness.

The shape (outer shape) of the silica abrasive may be globular or non-globular. For instance, specific examples of the silica abrasive having non-globular forms include a peanut-shaped (i.e., peanut shell-shaped) abrasive, a cocoon-shaped abrasive, a conpeito-shaped abrasive, and a rugby ball-shaped abrasive. In the art disclosed herein, the silica abrasive may take a primary particle form, or a secondary particle form consisting of a plurality of primary particles associating with one another. The silica abrasive may also include a mixture of primary particle forms and secondary particle forms. In a preferred embodiment, at least a part of the silica abrasive is contained in a secondary particle form in the polishing composition.

The silica abrasive to be preferably employed can have an average primary particle diameter of more than 5 nm. In view of a polishing removal rate or the like, the average primary particle diameter of the silica abrasive is preferably 15 nm or more, more preferably 20 nm or more, even more preferably 25 nm or more, and particularly preferably 30 nm or more. The upper limit of the average primary particle diameter of the silica abrasive is not particularly limited, but is suitably roughly 120 nm or less, preferably 100 nm or less, and more preferably 85 nm or less. For example, in view of combining a polishing removal rate and a surface quality at higher levels, preferred are silica abrasive having an average primary particle diameter of 12 nm or more to 80 nm or less, and 15 nm or more to 75 nm or less.

The average secondary particle diameter of the silica abrasive is not particularly limited, but is, in view of a polishing removal rate or the like, preferably 20 nm or more, more preferably 50 nm or more, and yet more preferably 70 nm or more. Furthermore, in view of providing a higher-quality surface, the average secondary particle diameter of the silica abrasive is suitably 500 nm or less, preferably 300 nm or less, more preferably 200 nm or less, yet more preferably 130 nm or less, and particularly preferably 110 nm or less (e.g., 100 nm or less).

The true specific gravity (true density) of the silica particles is preferably 1.5 or more, more preferably 1.6 or more, and even more preferably 1.7 or more. Increase in the true specific gravity of the silica particles leads to a tendency to a higher physical ability for polishing. The upper limit of the true specific gravity of the silica particles is not particularly limited, but typically 2.3 or less, e.g., 2.2 or less, 2.0 or less, or 1.9 or less. As the true specific gravity of the silica particles, a measured value can be employed by a liquid displacement method using ethanol as a displacing liquid.

The shape (outer shape) of the silica particles is preferably globular. Without limitation, the average value of the major axis/minor axis ratios of the particles (average aspect ratio) is theoretically 1.00 or more, and may also be e.g., 1.05 or more or 1.10 or more in view of improving a polishing removal rate. Moreover, the average aspect ratio of the particles is suitably 3.0 or less, and may be 2.0 or less. In view of improved smoothness of a surface to be polished, less scratching, etc., the average aspect ratio of the particles is preferably 1.50 or less, and may be 1.30 or less, or 1.20 or less.

The shape (outer shape), average aspect ratio, and the like of the particles can be acquired by, e.g., electron microscopy. A specific procedure for acquiring the average aspect ratio can be, for example, extracting shapes of a predetermined number (e.g., 200) of the particles using a scanning electron microscope (SEM); drawing a minimum rectangle circumscribed to a shape of each of the extracted particles; then calculating, as a major axis/minor axis ratio (aspect ratio), a value by dividing the long side length (major axis value) by the short side length (minor axis value) for the rectangle drawn for the shape of each of the particles; and deriving the average aspect ratio from an arithmetic average of the aspect ratios for the predetermined number of the particles.

In an embodiment where the polishing composition contains a silica abrasive, the polishing composition may further contain an abrasive made of a material other than silica (hereinafter also referred to as a non-silica abrasive). Examples of particles contained in such a non-silica abrasive include particles substantially including any of the following: oxide particles such as alumina particles, cerium oxide particles, chromium oxide particles, titanium dioxide particles, zirconium oxide particles, magnesium oxide particles, manganese oxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate. In some embodiments of a polishing composition containing a silica abrasive and a non-silica abrasive, the content of a non-silica abrasive in the total weight of abrasives contained in the polishing composition may be, e.g., 30% by weight or less, 20% by weight or less, or 10% by weight or less.

The content of the abrasive (e.g., a silica abrasive, an alumina abrasive) in the polishing composition disclosed herein is not particularly limited if being a concentration that can provide a polishing composition satisfying both of the formulae (1) and (2), both of the formulae (3) and (4), or both of the formulae (6) and (7), and can be appropriately set so as to achieve a desired effect corresponding to a purpose of use and an embodiment of use of the polishing composition. The content of the abrasive may be, e.g., less than 5% by weight, less than 3% by weight, or less than 2% by weight. In view of reducing increase in pad temperature, the content of the abrasive is preferably less than 1% by weight, more preferably less than 0.5% by weight, and even preferably 0.4% by weight or less, and may be 0.3% by weight or less, or 0.2% by weight or less. In some embodiments, the content of the abrasive in the polishing composition may be 0.1% by weight or less or less than 0.1% by weight, may be 0.05% by weight or less or less than 0.05% by weight, may be 0.04% by weight or less or less than 0.04% by weight, or may be 0.03% by weight or less or less than 0.03% by weight. The lower limit of the content of the abrasive is not particularly limited, and may be, e.g., 0.000001% by weight or more (i.e., 0.01 ppm or more). In view of enhancing an effect of use of the abrasive, the content of the abrasive in the polishing composition in some embodiments may be 0.00001% by weight or more, 0.0001% by weight or more, 0.001% by weight or more, 0.002% by weight or more, or 0.005% by weight or more. When the polishing composition disclosed herein contains a plural kinds of abrasives, the content of the abrasive in the polishing composition refers to the total content of the plural kinds of abrasives.

It is preferable that the polishing composition disclosed herein not substantially contain diamond particles as the particles. Diamond particles have a high hardness and thus can be a factor for limited improvement in smoothness. Diamond particles are also generally expensive and thus not necessarily a beneficial material in terms of cost performance, and there may be less dependence on high-price materials such as diamond particles in terms of practical use. The particles not substantially containing diamond particles, as used herein, means that the proportion of diamond particles in all the particles is 1% by weight or less, more preferably 0.5% by weight or less, and typically 0.1% by weight or less, including a case where the proportion of diamond particles is 0% by weight. In such an embodiment, an effect of applying the present invention can be preferably exerted.

(Permanganate)

The polishing composition disclosed herein contains permanganate. In polishing of a material to be polished (e.g., a non-oxide material with high hardness, such as silicon carbide), permanganate can typically function as an oxidant, and thereby exert an effect to improve a polishing removal rate. As exemplary permanganate, preferred is alkali metal permanganate such as sodium permanganate or potassium permanganate, and particularly preferred is potassium permanganate. Permanganate may be present in an ion form in the polishing composition.

In some embodiment of the polishing composition disclosed herein, the ratio of the concentration $C_1$ [mM] of permanganate to the content $W_1$ [% by weight] of the abrasive, i.e., $C_1/W_1$, is preferably 500 or more. In other words, $C_1$ and $W_1$ have a linear relationship, and there is a tendency that larger $C_1/W_1$ is accompanied by larger contribution of chemical polishing relative to contribution of mechanical polishing. Improving a polishing removal rate in composition satisfying $500 \leq C_1/W_1$ allows preferably combining a high polishing removal rate and reduction of increase in pad temperature. In some embodiments, $C_1/W_1$ may be 700 or more, or 1000 or more, and further may be 1500 or more, 3000 or more, 5500 or more, or 7500 or more. The upper limit of $C_1/W_1$ is not particularly limited, but in view of preservation stability of the polishing composition, can be, e.g., approximately 100000 or less, and may be 20000 or less, 75000 or less, 50000 or less, 10000 or less, or 9000 or less. In some embodiments, $C_1/W_1$ may be 7000 or less, 5000 or less, or 3000 or less.

In some embodiments of the polishing composition disclosed herein, the ratio of the concentration $C_1$ [mM] of permanganate to the square root of the content $W_1$ [% by weight] of the abrasive, i.e., $C_1/\sqrt{(W_1)}$, is preferably 200 or more. In other words, $C_1$ and $W_1$ have a non-linear relationship, and there is a tendency that larger $C_1/\sqrt{(W_1)}$ is accompanied by larger contribution of chemical polishing relative to contribution of mechanical polishing. Improving a polishing removal rate in composition satisfying $200 \leq C_1/\sqrt{(W_1)}$ allows preferably combining a high polishing removal rate and reduction of increase in pad temperature. In some embodiments, $C_1/\sqrt{(W_1)}$ may be 300 or more, or 750 or more, and further may be 1500 or more, 2500 or more, 3500 or more, or 4500 or more. The upper limit of $C_1/\sqrt{(W_1)}$ is not particularly limited, but in view of preservation stability of the polishing composition, can be, e.g., approximately 12000 or less, and may be 10000 or less, 8000 or less, or 6000 or less. In some embodiments, $C_1/\sqrt{(W_1)}$ may be 4500 or less, 3500 or less, or 2500 or less.

The concentration (content) of permanganate in any of the polishing compositions disclosed herein is not particularly limited if being a concentration that can provide a polishing composition satisfying both of the formulae (1) and (2), both of the formulae (3) and (4), or both of the formulae (6) and (7), and can be appropriately set so as to achieve a desired effect corresponding to a purpose of use and an embodiment of use of the polishing composition. In some embodiments, in view of improving a polishing removal rate, the concentration of permanganate is suitably approximately 5 mM or more (i.e., 0.005 mol/L or more). In view of improving a polishing removal rate, the concentration of permanganate is preferably 10 mM or more, and more preferably 30 mM or more, and may be 50 mM or more, 70 mM or more, or 90 mM or more. In view of facilitating achieving a higher polishing removal rate, the concentration of permanganate in some embodiments may be 120 mM or more, 140 mM or more, or 160 mM or more. Additionally, in some embodiments, the concentration of permanganate in the polishing composition is suitably approximately 1000 mM or less, preferably 750 mM or less, and more preferably 500 mM or less, and may be 400 mM or less, or 300 mM or less. Less concentration of permanganate can be advantageous in view of reducing increase in pad temperature. In such view, the concentration of permanganate in some embodiments may be 250 mM or less, 200 mM or less, 150 mM or less, or 120 mM or less.

(Aluminum Salt)

The polishing composition disclosed herein contains an aluminum salt. In regard to composition containing an aluminum salt in addition to the abrasive and permanganate, the polishing composition satisfying the relational expressions of the formulae (1) and (2) allows effectively combining improvement in a polishing removal rate and reduction of increase in pad temperature. Moreover, in regard to composition containing an aluminum salt in addition to the abrasive and permanganate, the polishing composition satisfying the relational expressions of the formulae (3) and (4) or the relational expressions of the formulae (6) and (7) allows reducing increase in pad temperature as well as gaining a polishing removal rate, and improving preservation stability (shelf life).

The kind of a salt in the aluminum salt is not particularly limited, and may be an inorganic acid salt or an organic acid salt. Examples of the inorganic acid salt include salts of hydrohalic acid such as hydrochloric acid, hydrobromic acid, and hydrofluoric acid; nitric acid; sulfuric acid; carbonic acid; silicic acid; boric acid; and phosphoric acid. Examples of the organic acid salt include salts of carboxylic acids such as formic acid, acetic acid, propionic acid, benzoic acid, glycine acid, butyric acid, citric acid, tartaric acid, and trifluoroacetic acid; organic sulfonic acids such as methanesulfonic acid, trifluoromethanesulfonic acid, benzenesulfonic acid, and toluenesulfonic acid; organic phosphonic acids such as methylphosphonic acid, benzenephosphonic acid, and toluenephosphonic acid; and organic phosphoric acid such as ethylphosphoric acid. In particular, preferred are salts of hydrochloric acid, nitric acid, sulfuric acid and phosphoric acid, and more preferred are salts of hydrochloric acid, nitric acid, and sulfuric acid.

In some embodiments of the polishing composition disclosed herein, the ratio (C2/C1) of the concentration C2 [mM] of the aluminum salt (represented by the total concentration if containing a plurality of aluminum salts) and the concentration C1 [mM] of permanganate (represented by the total concentration if containing a plurality of permanganates) is 0.04 or more. In the composition satisfying the formula (1) and having a C2/C1 of 0.04 or more, improvement of a polishing removal rate and reduction of increase in pad temperature can be preferably achieved in combination. Without wishing to be bound by any theory, an exemplary reason for providing these effects by satisfying the relational expressions of the formulae (1) and (2) may be as follows: permanganate contained in the polishing composition can oxidize a surface of a material to be polished (particularly, a non-oxide material with high hardness, such as silicon carbide) and make it fragile, and thereby contribute to improvement in a polishing removal rate. However, the oxidization can be a factor for raising pH of the polishing composition supplied to a material to be polished. Consequently, once the pH of the polishing composition supplied to a material to be polished rises from an initial pH (i.e., the pH at an initial supply to the material to be polished) and deviates from an appropriate pH range during polishing of the material to be polished, the polishing composition has reduction in chemical polishing performance on the material to be polished. The decrease in chemical polishing performance of the polishing composition may lead to reduction in a polishing removal rate and relative increase in contribution of mechanical polishing performance, thereby facilitating increasing pad temperature. Note that the discussion described above does not limit the scope of the present invention.

In view of combining improvement in a polishing removal rate and reduction of increase in pad temperature at a higher level, C2/C1 in some embodiments is preferably 0.05 or more, and more preferably 0.06 or more, and may be 0.07 or more, 0.08 or more, or 0.10 or more. The upper limit of C2/C1 is not particularly limited, but is suitably roughly 200 or less, and may be 100 or less, 75 or less, or 50 or less. In some preferred embodiments, C2/C1 may be 20 or less, 10 or less, 5 or less, 1 or less, 0.6 or less, 0.5 or less, 0.3 or less, or 0.2 or less.

The concentration (content) of the aluminum salt in the polishing composition is not particularly limited if being a concentration that can provide a polishing composition satisfying both of the formulae (1) and (2), both of the formulae (3) and (4), or both of the formulae (6) and (7), and can be appropriately set so as to achieve a desired effect corresponding to a purpose of use and an embodiment of use of the polishing composition. The concentration of the aluminum salt may be, e.g., approximately 1000 mM or less, 500 mM or less, or 300 mM or less. In some embodiments, the concentration of the aluminum salt is suitably approximately 200 mM or less, preferably 100 mM or less, and more preferably 50 mM or less, and may be 30 mM or less, 20 mM or less, or 10 mM or less. The lower limit of the concentration of the aluminum salt may be, e.g., 0.1 mM or more, and in view of appropriately exerting an effect of use of the aluminum salt, advantageously 1 mM or more, and in view of preservation stability, preferably 5 mM or more, and more preferably 7 mM or more (e.g., 8 mM or more). The art disclosed herein can also be preferably implemented, e.g., in an embodiment where the concentration of the aluminum salt in the polishing composition is 10 mM or more, 20 mM or more, or 30 mM or more.

The relation of the concentration of the aluminum salt and the content of the abrasive is not particularly limited if being a concentration that can provide a polishing composition satisfying both of the formulae (1) and (2), both of the formulae (3) and (4), or both of the formulae (6) and (7), and can be appropriately set so as to achieve a desired effect corresponding to a purpose of use and an embodiment of use. The ratio of the concentration C2 [mM] of the aluminum salt to the content W1 [% by weight] of the abrasive, i.e., C2/W1, can be, e.g., 5 or more, is preferably 10 or more, more preferably 30 or more, and may be 50 or more, or 80 or more. In some embodiments, C2/W1 may be 150 or more, 300 or more, 500 or more, or 800 or more. The upper limit of C2/W1 is not particularly limited, and in view of preservation stability of the polishing composition, can be, e.g., approximately 10000 or less, and may be 5000 or less, or 2500 or less. In some embodiments, C2/W1 may be 1000 or less, 800 or less, or 600 or less.

Note that in the "C2/W1" described above, "C2" represents a numerical value part in indication of the concentration of the aluminum salt in the polishing composition by a unit "mM"; "W1" represents a numerical value part in indication of the content of the abrasive in the polishing composition by a unit "% by weight"; and both C2 and W1 are dimensionless numbers.

(Alkaline-Earth Metal Salt)

The polishing composition disclosed herein may contain at least one kind of metal salt $A_{EMS}$ selected from alkaline-earth metal salts as an optional component. As metal salt $A_{EMS}$, a single kind of alkaline-earth metal salt can be used, or two or more kinds of alkaline-earth metal salts can be used in combination. Combination use of an aluminum salt and metal salt $A_{EMS}$ can better reduce increase in pad temperature. Metal salt $A_{EMS}$ preferably contains any one kind or two or more kinds of Mg, Ca, Sr and Ba, as an element(s) belonging to alkaline-earth metals. In particular, either of Ca or Sr is preferable, and Ca is more preferable.

The kind of a salt in metal salt $A_{EMS}$ is not particularly limited, and may be an inorganic acid salt or an organic acid salt. Examples of the inorganic acid salt include salts of hydrohalic acid such as hydrochloric acid, hydrobromic acid, and hydrofluoric acid; nitric acid; sulfuric acid; carbonic acid; silicic acid; boric acid; and phosphoric acid. Examples of the organic acid salt include salts of carboxylic acids such as formic acid, acetic acid, propionic acid, benzoic acid, glycine acid, butyric acid, citric acid, tartaric acid, and trifluoroacetic acid; organic sulfonic acids such as methanesulfonic acid, trifluoromethanesulfonic acid, benzenesulfonic acid, and toluenesulfonic acid; organic phosphonic acids such as methylphosphonic acid, benzenephosphonic acid, and toluenephosphonic acid; and organic phosphoric acid such as ethylphosphoric acid. In particular, preferred are salts of hydrochloric acid, nitric acid, sulfuric acid, and phosphoric acid, and more preferred are salts of hydrochloric acid and nitric acid. The art disclosed herein can be preferably implemented e.g., in an embodiment with using a nitrate or chloride of an alkaline-earth metal as metal salt $A_{EMS}$.

Specific examples of an alkaline-earth metal salt to be a potential option of metal salt $A_{EMS}$ include chlorides such as magnesium chloride, calcium chloride, strontium chloride, and barium chloride; bromides such as magnesium bromide; fluorides such as magnesium fluoride, calcium fluoride, strontium fluoride, and barium fluoride; nitrates such as magnesium nitrate, calcium nitrate, strontium nitrate, and barium nitrate; sulfates such as magnesium sulfate, calcium sulfate, strontium sulfate, and barium sulfate; carbonates such as magnesium carbonate, calcium carbonate, strontium carbonate, and barium carbonate; and carboxylates such as calcium acetate, strontium acetate, calcium benzoate, and calcium citrate.

Metal salt $A_{EMS}$ is preferably a water-soluble salt. Use of metal salt $A_{EMS}$ with water solubility can efficiently form a good surface with less flaws such as a scratch.

Metal salt $A_{EMS}$ contained in the polishing composition is preferably a compound not to be oxidized by permanganate contained in the composition. In such view, appropriate selection of permanganate and metal salt $A_{EMS}$ allows preventing deactivation of the permanganate due to oxidization of metal salt $A_{EMS}$ by the permanganate, and reducing age-related deterioration of performance of the polishing composition (e.g., reduction in a polishing removal rate). One example of a preferable combination of permanganate and metal salt $A_{EMS}$ is a combination of potassium permanganate and calcium nitrate.

In some embodiments containing metal salt $A_{EMS}$, an aluminum salt and metal salt $A_{EMS}$ may have the same anion species. Anion species common between the aluminum salt and metal salt $A_{EMS}$ may be, e.g., nitrate, hydrochloride, sulfate, or phosphate. Additionally, in some embodiments containing metal salt $A_{EMS}$, an aluminum salt and metal salt $A_{EMS}$ may have different anion species.

In a polishing composition containing metal salt $A_{EMS}$, the concentration (content) of metal salt $A_{EMS}$ is not particularly limited, and can be appropriately set so as to achieve a desired effect, corresponding to a purpose of use, an embodiment of use, etc. of the polishing composition. The concentration of metal salt $A_{EMS}$ may be, e.g., approximately 1000 mM or less, 500 mM or less, or 300 mM or less. In combination use with an aluminum salt, in view of effectively combining improvement in a polishing removal rate and reduction of increase in pad temperature, the concentration of metal salt $A_{EMS}$ in some embodiments is suitably 200 mM or less, preferably 100 mM or less, and more preferably 50 mM or less, and may be 30 mM or less, 20 mM or less, or 10 mM or less. The lower limit of the concentration of metal salt $A_{EMS}$ may be, e.g., 0.1 mM or more, and in view of appropriately exerting an effect of use of metal salt $A_{EMS}$, preferably 0.5 mM or more, and more preferably 1 mM or more, and may be 2.5 mM or more, or 5 mM or more. The art disclosed herein can be preferably implemented in, e.g., an embodiment where the concentration of metal salt $A_{EMS}$ in the polishing composition is 0.5 mM to 100 mM, or 1 mM to 50 mM.

Without no particular limitation, in view of facilitating appropriate exertion of an effect caused by use of metal salt $A_{EMS}$, the ratio of the concentration C3 [mM] of metal salt $A_{EMS}$ (represented by the total concentration if containing a plurality of metal salts $A_{EMS}$) to the concentration C1 [mM] of permanganate (represented by the total concentration if containing a plurality of oxidants) in the polishing composition (C3/C1) is preferably 0.001 or more, and more preferably 0.005 or more, and may be 0.01 or more, or 0.02 or more. In some embodiments, C3/C1 may be e.g., 0.03 or more, 0.05 or more, or 0.07 or more. The upper limit of C3/C1 is not particularly limited, but is suitably roughly 100 or less, and may be 50 or less, 10 or less, or 5 or less. In some preferred embodiments, C3/C1 may be 1 or less, 0.5 or less, 0.3 or less, or 0.1 or less. Such a concentration ratio of metal salt $A_{EMS}$ to permanganate (C3/C1) can preferably exert an effect caused by further containing metal salt $A_{EMS}$.

The relation between the concentration C3 [mM] of metal salt $A_{EMS}$ and the concentration C2 [mM] of an aluminum salt is not particularly limited, and can be set so as to appropriately exert an effect caused by combination use thereof. For example, C3/C2 may fall within the range of 0.001 to 1000. In view of preferably combining improvement in a polishing removal rate and reduction of increase in pad temperature, C3/C2 in some embodiments is suitably approximately 0.01 or more, and preferably 0.05 or more (e.g., 0.1 or more). C3/C2 is also suitably approximately 100 or less, preferably 50 or less, and more preferably 25 or less (e.g., 10 or less).

A relation between the concentration of metal salt $A_{EMS}$ and the content of the abrasive is not particularly limited, and can appropriately set so as to achieve a desired effect corresponding to a purpose of use, an embodiment of use, etc. The ratio of the concentration C3 [mM] of metal salt $A_{EMS}$ to the content W1 [% by weight] of the abrasive, i.e., C3/W1, can be, e.g., 5 or more, is preferably 10 or more, more preferably 30 or more, and may be 50 or more, or 80 or more. Larger C3/W1 tends to be accompanied by larger contribution of chemical polishing relative to contribution of mechanical polishing. Such composition can preferably exhibit an effect to reduce increase in pad temperature by combination use of an aluminum salt and metal salt $A_{EMS}$. In some embodiments, C3/W1 may be 100 or more, 150 or more, 200 or more, 300 or more, or 500 or more. The upper limit of C3/W1 is not particularly limited, and in view of preservation stability of the polishing composition, can be, e.g., approximately 5000 or less, and may be 2500 or less, or 1000 or less. In some embodiments, C3/W1 may be 900 or less, 700 or less, or 500 or less.

Note that "C3" in the "C3/W1" represents a numerical value part in indication of the concentration of metal salt $A_{EMS}$ in the polishing composition by a unit "mM". Thus, C3 is a dimensionless number.

(Water)

The polishing composition disclosed herein contains water. As water, ion-exchange water (deionized water), pure water, ultrapure water, distilled water, or the like can be preferably used. The polishing composition disclosed herein may further contain an organic solvent (lower alcohol, lower ketone, or the like) that can be uniformly mixed with water, as necessary. Usually, it is appropriate that 90 vol % or more of the solvent contained in the polishing composition be water, it is preferable that 95 vol % or more thereof be water, and it is more preferable that 99 to 100 vol % thereof be water.

(Acid)

The polishing composition can contain an acid as necessary, for the purpose of pH adjustment, improvement in a polishing removal rate, and the like. As the acid, both inorganic and organic acids can be used. Examples of the inorganic acids include sulfuric acid, nitric acid, hydrochloric acid, and carbonic acid. Examples of the organic acids include aliphatic carboxylic acids such as formic acid, acetic acid and propionic acid; aromatic carboxylic acids such as benzoic acid and phthalic acid; citric acid; oxalic acid; tartaric acid; malic acid; maleic acid; fumaric acid; succinic acid; organic sulfonic acid; and organic phosphonic acid. These can be used as a single kind or in combination of two or more kinds thereof. In use of the acid, the amount to be used is not particularly limited, and can be set according to a purpose of use (e.g., pH adjustment). Alternatively, in some embodiments of the polishing composition disclosed herein, the composition may contain substantially no acid.

(Basic Compound)

The polishing composition can contain a basic compound as necessary, for the purpose of pH adjustment, improvement in a polishing removal rate, and the like. The basic compound as used herein refers to a compound that has a function to raise pH of the polishing composition by being added to the composition. Examples of the basic compound include alkali metal hydroxides such as potassium hydroxide and sodium hydroxide; carbonates or hydrogencarbonates such as ammonium bicarbonate, ammonium carbonate, potassium bicarbonate, potassium carbonate, sodium bicarbonate, and sodium carbonate; ammonia; quaternary ammonium compounds including quaternary ammonium hydroxides such as tetramethylammonium hydroxide, tetraethylammonium hydroxide, and tetrabutylammonium hydroxide; others, such as amines, phosphates and hydrogen phosphates, and organic acid salts. The basic compound can be used as a single kind or in combination of two or more kinds. In use of the basic compound, the amount to be used is not particularly limited, and can be set corresponding to a purpose of use (e.g., pH adjustment). Alternatively, in some embodiments of the polishing composition disclosed herein, the composition may contain substantially no basic compound.

(Other Components)

The polishing composition disclosed herein may further contain, as necessary, a known additive that can be used for polishing compositions (e.g., a polishing composition used for polishing a high hardness material such as silicon carbide), such as a chelating agent, a thickener, a dispersant, a surface protective agent, a wetting agent, a surfactant, a corrosion inhibitor, an antiseptic agent, or an antifungal agent, as far as an effect of the present invention is not impaired. Since the content of the additive only has to be appropriately set corresponding to the purpose of addition thereof and does not characterize the present invention, a detailed description thereof will be omitted.

(pH)

The pH of the polishing composition is suitably about 1 to 12. The pH within the range facilitates achievement of a practical polishing removal rate. In some embodiments, the pH may be 12.0 or less, 11.0 or less, 10.0 or less, 9.0 or less, less than 9.0, 8.0 or less, less than 8.0, 7.0 or less, less than 7.0, or 6.0 or less. In view of facilitating more exertion of effects to improve a polishing removal rate and to reduce increase in pad temperature by combination use of metal salt $A_{EMS}$ and an aluminum salt, the pH of the polishing composition in some embodiments is preferably less than 6.0, and may be 5.0 or less, less than 5.0, 4.0 or less, or less than 4.0. The pH may be, e.g., 1.0 or more, 1.5 or more, 2.0 or more, or 2.5 or more.

A method for preparing the polishing composition disclosed herein is not particularly limited. For example, each component to be contained in the polishing composition may be mixed using a well-known mixing device such as a blade stirrer, an ultrasonic disperser, or a homomixer. An embodiment for mixing these components is not particularly limited, and, for example, all components may be mixed at once or in an appropriately set order.

The polishing composition disclosed herein may be a single-agent type or a multi-agent type such as a two-agent type. For example, the polishing composition may be configured to be used for polishing an object to be polished, by mixing of part A, which contains a part of components of the polishing composition (e.g., a component other than water), and part B, which contains the remaining components. These components may be, for example, separated and stored before use, and then mixed in use to prepare the polishing composition in a single liquid. In mixing, dilution water and the like may be further mixed.

<Object to be Polished>

An object to be polished in the polishing composition disclosed herein is not particularly limited. For example, the polishing composition disclosed herein can be applied to polishing of a substrate having a surface formed of a compound semiconductor material, i.e., a compound semiconductor substrate. A component material of the compound semiconductor substrate is not particularly limited, and examples thereof can include group II-VI compound semiconductors such as cadmium telluride, zinc selenide, cadmium sulfide, mercury cadmium telluride, and cadmium zinc telluride; group III-V compound semiconductors such as gallium nitride, gallium arsenide, gallium phosphide, indium phosphide, aluminum gallium arsenide, gallium indium arsenide, indium gallium arsenide nitride, aluminum gallium indium phosphide; IV-IV group compound semiconductors such as silicon carbide and germanium silicide. Such a material may be a conductive one doped with impurities, or an insulating or semi-insulating one not doped with impurities. A plurality of the materials listed above may form an object to be polished. In a preferred embodiment, the polishing composition disclosed herein can be applied to polishing of a substrate having a surface formed of a chemical semiconductor material other than oxides (i.e., a non-oxide). Polishing of a substrate having a surface formed of a non-oxide chemical semiconductor material is likely to lead to preferable exertion of an effect to promote polishing by an oxidant (typically, permanganate) contained in the polishing composition disclosed herein.

The polishing composition disclosed herein can be preferably used for polishing e.g., a surface of an object to be polished having a Vickers hardness of 500 Hv or more. Such a Vickers hardness is preferably 700 Hv or more, e.g., 1000 Hv or more or 1500 Hv or more. The Vickers hardness of a material to be polished may be 1800 Hv or more, 2000 Hv or more, or 2200 Hv or more. The upper limit of the Vickers hardness of an object to be polished is not particularly limited, and may be e.g., approximately 7000 Hv or less, 5000 Hv or less, or 3000 Hv or less. Herein the Vickers hardness can be measured in accordance with JIS R 1610: 2003. The international standard corresponding to this standard in JIS is ISO 14705: 2000.

Examples of the material having a Vickers hardness of 1500 Hv or more include silicon carbide, silicon nitride, titanium nitride, and gallium nitride. An object to be polished in the art disclosed herein may have a monocrystalline surface of such a material with mechanical and chemical stability. In particular, a surface of an object to be polished is preferably formed of either of silicon carbide or gallium nitride, and more preferably formed of silicon carbide. Silicon carbide has been expected as a compound semiconductor substrate material having less power loss and good heat resistance, etc., and thus there is a particularly large practical advantage of improvement of productivity by increasing a polishing removal rate. The art disclosed herein can be particularly preferably applied to polishing of a monocrystalline surface of silicon carbide.

<Polishing Method>

The polishing composition disclosed herein can be used for polishing an object to be polished in an exemplary embodiment including the following operations.

That is, a polishing slurry (slurry) containing any of the polishing compositions disclosed herein is prepared. Preparation of the polishing slurry may include preparing the polishing slurry by subjecting the polishing composition to operations such as concentration adjustment (e.g., dilution) and pH adjustment. Alternatively, the polishing composition may be directly used as a polishing slurry. In use of a multi-agent type polishing composition, preparation of the polishing slurry may include mixing the agents thereof, diluting one or more of the agents before the mixing, diluting the resulting mixture after the mixing, and the like.

Next, the polishing slurry is supplied to an object to be polished, and subjected to polishing by a common method performed by those skilled in the art. For example, one method is to set an object to be polished in a common polishing machine and supply the polishing slurry to a surface to be polished of the object to be polished through a polishing pad of the polishing machine. Typically, while supplying the polishing slurry continuously, the polishing pad is pressed against the surface to be polished of the object to be polished, and both of the surface and the pad are moved (e.g., rotated) relative to each other. Polishing of the object to be polished is completed through such a polishing step.

Note that the aforementioned content and content ratio for each component that can be contained in the polishing composition in the art disclosed herein typically means the content and content ratio in the polishing composition in practical supply to an object to be polished (i.e., at a point of use), and therefore can be translated as the content and content ratio in the polishing slurry.

The specification provides a polishing method for polishing an object to be polished (typically, a material to be polished) and a method for producing a polished object using the polishing method. The polishing method is characterized by including a step of polishing an object to be polished using the polishing composition disclosed herein. A polishing method according to one preferred embodiment includes a step of performing preliminary polishing (preliminary polishing step) and a step of performing final polishing (final polishing step). In one typical embodiment, the preliminary polishing step is a polishing step set immediately before the final polishing step. The preliminary polishing step may be a single-step polishing step or a polishing step including two or more sub-steps. The final polishing step as referred to herein designates a step of applying final polishing to an object to be polished that experienced preliminary polishing, specifically, a polishing step set at the end (i.e., on the most downstream) of polishing steps performed with a polishing slurry containing an abrasive. In such a polishing method including the preliminary polishing step and the final polishing step, the polishing composition disclosed herein may be used in the preliminary polishing step, may be used in the final polishing step, or may be used in both of the preliminary polishing step and the final polishing step.

The preliminary polishing and the final polishing can be applied to polishing using either a single-side polishing machine or a double-side polishing machine. In a single-side polishing machine, one side of an object to be polished is polished by attaching the object to be polished to a ceramic plate with wax, holding the object to be polished with a holder called a carrier, and then pressing a polishing pad against one side of the object to be polished and moving both relative to each other with supplying a polishing composition. This movement is, e.g., rotational movement. In a double-side polishing machine, both sides of an object to be polished are polished simultaneously by holding the object to be polished with a holder called a carrier, and then pressing polishing pads against opposing sides of the object to be polished and rotating them relative to one another with supplying a polishing composition from above.

Conditions of the polishing described above are appropriately set based on the kind of a material to be polished, surface properties of interest (specifically, smoothness), a polishing removal rate and the like, and thus are not limited to particular conditions. For example, with regard to processing pressure, the polishing composition disclosed herein can be used within a wide pressure range such as 10 kPa or more to 150 kPa or less. In view of preferably combining a high polishing removal rate and reduction of increase in pad temperature, the processing pressure in some embodiments may be, e.g., 20 kPa or more, 30 kPa or more, or 40 kPa or more, and can also be 100 kPa or less, 80 kPa or less, or 60 kPa or less. The polishing composition disclosed herein can also be preferably used in polishing under processing conditions, e.g., with 30 kPa or more or higher, thereby allowing enhancing productivity of a target product derived via the polishing (a polished object). The processing pressure referred to herein is synonymous with polishing pressure.

In the polishing, the rotational speed of a platen and the rotational speed of a head in a polishing machine is not particularly limited, and can be, e.g., about 10 rpm to 200 rpm. The rotational speeds may be, e.g., 20 rpm or more, or 30 rpm or more. In view of easily providing a higher polishing removal rate, the rotational speed in some embodiments is preferably 55 rpm or more, and more preferably 70 rpm or more, and may be 85 rpm or more, 100 rpm or more, or 115 rpm or more. Polishing with use of the polishing composition disclosed herein can use an aluminum salt in the polishing composition containing permanganate and thereby reduce increase in pad temperature, and thus can be preferably implemented even at such a relatively high rotational speed, thereby allowing enhancing productivity of a target product derived via the polishing (a polished object). Additionally, in view of reducing increase in pad temperature, lightening a load of a polishing machine, etc., the rotational speed in some embodiments can be, e.g., 180 rpm or less, and may be 160 rpm or less, or 140 rpm or less. The rotational speed of a platen and the rotational speed of a head may be the same or different.

In the polishing, a supply rate of the polishing composition to an object to be polished can be, e.g., 200 mL/min or less, and may be 150 mL/min or less, or 100 mL/min or less per 78.54 cm$^2$ of an area to be polished (corresponding to one surface of a 4-inch wafer). The lower limit of a supply rate can be, e.g., 5 mL/min or more, and may be 10 mL/min or more, or 15 mL/min or more.

Lowering a supply rate of the polishing composition is preferable in view of lightening environmental burden by reduction of waste liquid, and saving a space for a polishing facility. On the other hand, lowering a supply rate of the polishing composition generally causes the polishing composition to remain on an object to be polished for a longer time. This may make rise in pH of the polishing composition likely to occur on an object to be polished. Moreover, lowering a supply rate of the polishing composition tends to be generally accompanied by less amount of heat removed by circulation of the polishing composition, providing disadvantage in view of reducing increase in pad temperature. Polishing with use of the polishing composition disclosed herein can use an aluminum salt in the polishing composition containing permanganate and thereby reduce rise in pH of the polishing composition on an object to be polished and increase in pad temperature, and thus can be preferably implemented even at a relatively small supply rate of the polishing composition. For example, the polishing can be preferably implemented at a supply rate of 50 mL/min or less, 35 mL/min or less, and further also 25 mL/min or less per 78.54 cm$^2$ of an area to be polished.

The polishing pad used in each polishing step disclosed here is not particularly limited. For example, any of a non-woven fabric type, a suede type, and a hard foamed polyurethane type may be used. In some embodiments, a non-woven fabric type polishing pad may be preferably employed. In an embodiment using the polishing pad described above, an effect to reduce increase in pad temperature, which is an effect provided by the art disclosed herein, is preferably exerted. The polishing pad used in the art disclosed herein is an abrasive-free polishing pad.

An object to be polished that is polished by the method disclosed herein is typically cleaned after polishing. The cleaning can be performed using a suitable cleaning solution. The cleaning solution to be used is not particularly limited, and a known or conventional cleaning solution can be appropriately selected and used.

The polishing method disclosed herein may include any other step in addition to the preliminary polishing step and final polishing step described above. Examples of such a step include a mechanical polishing step, and a lapping step performed before the preliminary polishing step. In the mechanical polishing step, an object to be polished is polished with a liquid of a diamond abrasive dispersed in a solvent. In some preferred embodiments, the dispersion contains no oxidant. The lapping step is a step of polishing with pressing a surface of a polishing platen, such as a cast iron platen, to an object to be polished. Therefore, in the lapping step, no polishing pad is used. The lapping step is typically performed by supplying an abrasive between a polishing platen and an object to be polished. The abrasive is typically a diamond abrasive. In addition, the polishing method disclosed herein may include an additional step before the preliminary polishing step or between the preliminary polishing step and the final polishing step. The additional step is, for example, a cleaning step or a polishing step.

<Production Method of Polished Object>

The art disclosed herein may include provision of a method for producing a polished object that includes a polishing step with use of any of the polishing methods described above and a polished object produced by the method. The production method of the polished object is, for example, a method for producing a silicon carbide substrate. That is, the art disclosed herein provides a method for producing a polished object that includes polishing an object to be polished having a surface made of a high hardness material by applying any of the polishing methods disclosed herein, and provides a polished object produced by the method. The production method described above can efficiently provide a substrate produced via polishing, such as a silicon carbide substrate.

EXAMPLES

Several examples relating to the present invention will be described below, but the present invention is not intended to be limited to embodiments shown in the examples. In the following description, "%" is on a weight basis unless otherwise specified.

Experimental Example 1

<Preparation of Polishing Composition>

Example A1

An alumina abrasive, potassium permanganate as permanganate, aluminum nitrate as an aluminum salt, and deionized water were mixed to prepare a polishing composition containing each component with the following concentration: 0.3% alumina abrasive, 189.8 mM potassium permanganate (calculated based on Mn), 30.1 mM aluminum nitrate (calculated based on Al).

Examples A2 to A5 and Comparative Examples A1 to A2

Each polishing composition according to a corresponding example was prepared in the same manner as in Example A1, except for changing the concentrations of an alumina abrasive, potassium permanganate, and aluminum nitrate as shown in Table 1.

Comparative Example A3

A polishing composition according to Comparative Example A3 was prepared in the same manner as in Example A3, except for not using aluminum nitrate.

In each polishing composition according to a corresponding example in Experimental Example 1, an α-alumina abrasive with an average primary particle diameter of 310 nm were used as an alumina abrasive. Each polishing composition according to a corresponding example was adjusted to pH 3.0 using nitric acid.

<Polishing of Object to be Polished>

A SiC wafer was preliminarily polished using a preliminary polishing composition including an alumina abrasive. The preliminarily polished SiC wafer was set as an object to be polished, and polished under the following polishing conditions using directly each polishing composition according to a corresponding example as a polishing slurry.
[Polishing Conditions]
  Polishing machine: model "RDP-500" (platen diameter: 20 inches), manufactured by Fujikoshi Machinery Corp.
  Polishing pal: "SUBA800XY" (non-woven fabric type), manufactured by Nitta Haas Incorporated (present Nitta Dupont Incorporated).
  Processing pressure: 44.1 kPa.
  Platen rotational speed: 120 revolutions/min.
  Head rotational speed: 120 revolutions/min.
  Supply rate of polishing slurry: 20 mL/min.
  Method of using polishing slurry: one-way.
  Polishing time: 15 mins.
  Object to be polished: 4-inch SiC wafer (conduction type: n-type, crystalline type: 4H-SiC, off angle to the C-axis of the main surface (0001):4°), 1 sheet/batch.
  Temperature of polishing slurry: 23° C.
<Measurement and Evaluation>
(Polishing Removal Rate)
After the SiC wafer was polished under the aforementioned polishing condition using each polishing composition of a corresponding example, a polishing removal rate was calculated according to the following calculation formulae (1) and (2):

The result thus obtained was substituted into the following formula: $\Delta T$ [° C.]=(pad temperature in Comparative Example A3)–(pad temperature in each example); on the basis of the $\Delta T$ (i.e., reduction in pad temperature relative to pad temperature in Comparative Example A3), an effect to reduce increase in pad was evaluated according to the following three grades and shown in Table 1. Larger $\Delta T$ means a higher effect to reduce pad temperature.
  A: having a $\Delta T$ of more than 0.6° C.
  B: having a $\Delta T$ of more than 0.3° C. to 0.6° C. or less.
  C: having a $\Delta T$ of 0.3° C. or less.
(Preservation Stability)
The polishing composition thus prepared was evaluated for preservation stability by performing an accelerated test with storage under an environment at 60° C. Specifically, each polishing composition according to a corresponding example was filled in a transparent polyethylene resin container, followed by tight seal, then the container was left to stand under an environment at 60° C., and the number of days until increase in the pH of the polishing composition in the container by 2 or more was recorded as preservation stability. Note that a preservation stability of 19 days in an accelerated test with storage at 60° C. corresponds to a preservation stability of approximately 12 months in storage at 25° C., according to conversion based on Arrhenius Law.

TABLE 1

| | Alumina abrasive content W1 [wt %] | Permanganate concentration C1 [mM] | Aluminum salt concentration C2 [mM] | C1/W1 | C1/√W1 | C2/C1 | Polishing removal rate (relative value) | Reduction of increase in pad temperature | Storage life in 60° C. accelarated test [day] |
|---|---|---|---|---|---|---|---|---|---|
| Example A1 | 0.3 | 189.8 | 30.1 | 633 | 347 | 0.159 | 124 | A | 44 |
| Example A2 | 0.1 | 189.8 | 30.1 | 1898 | 600 | 0.159 | 130 | A | 46 |
| Example A3 | 0.1 | 253.1 | 30.1 | 2531 | 800 | 0.119 | 129 | A | 45 |
| Example A4 | 0.1 | 189.8 | 20.0 | 1898 | 600 | 0.105 | 128 | A | 33 |
| Example A5 | 0.1 | 189.8 | 10.1 | 1898 | 600 | 0.053 | 130 | A | 19 |
| Comparative Example A1 | 0.1 | 38.0 | 1.3 | 380 | 120 | 0.035 | 44 | C | 8 |
| Comparative Example A2 | 0.1 | 38.0 | 30.1 | 380 | 120 | 0.794 | 60 | A | 46 |
| Comparative Example A3 | 0.1 | 253.1 | none | 2531 | 800 | — | 100 | C | 7 | polishing allowance [cm]=difference between weight of SiC wafer before and after polishing [g]/ density of SiC [g/cm³](=3.21 g/cm³)/area to be polished [cm²](=78.54 cm²)　　(1)

polishing removal rate [nm/h]=polishing allowance [cm]×10⁷/polishing time(=15/60 hours).　　(2)

The polishing removal rate thus obtained in each example was converted to a relative value to the value in Comparative Example A3 as 100, and shown in Table 1.
(Pad Temperature)
Temperature of a polishing pad during polishing under the aforementioned polishing conditions was measured. In measuring the pad temperature, a template using a backing material made of a suede material was used as a wafer support part. In polishing, the wafer was kept so as to attach to the suede material with water. As the pad temperature, an output value from a pad temperature measurement device (infrared thermal emission thermometer) mounted on the polishing machine was employed directly. Measurement was performed for 5 to 15 minutes after the beginning of polishing, and the average temperature during that span was defined as pad temperature during polishing with each polishing composition according to a corresponding example.

As shown in Table 1, the polishing compositions in Examples A1 to A5, where the ratio (C1/W1) of the concentration C1 [mM] of permanganate to the content W1 [% by weight] of abrasive was 500 or more, and/or the ratio (C1/√(W1)) of the concentration C1 [mM] of permanganate to the square root of the content W1 [% by weight] of abrasive was 200 or more, and where the ratio (C2/C1) of the concentration C2 [mM] of an aluminum salt to the concentration C1 [mM] of permanganate was 0.04 or more, provided an effect to improve a polishing removal rate as well as to reduce increase in pad temperature, relative to the polishing composition in Comparative Example A3, which contained no aluminum salt. By contrast, Comparative Examples A1 and A2, containing an aluminum salt but having small C1/W1 and/or C1/√(W1), significantly reduced in a polishing removal rate relative to Comparative Example A3. Comparative Example A1, having small C2/C1, exhibited a small effect to reduce increase in pad temperature.

Furthermore, in regard to preservation stability, Examples A1 to A5, having a higher concentration of an aluminum salt, provided better results (longer-term preservation stability) relative to Comparative Examples A1 and A3, which contained a low concentration of or no aluminum salt.

(In-Polishing pH)

During polishing under the polishing condition described above, a polishing slurry falling down from the outer end of the object to be polished was collected and measured for pH. The collection of the polishing slurry was caned out after a lapse of 7 minutes from the beginning of polishing. The results are shown in Table 2.

TABLE 2

|  | C2/C1 | Initial pH | In-polishing pH |
|---|---|---|---|
| Example A1 | 0.159 | 3.0 | 3.6 |
| Example A2 | 0.159 | 3.0 | 3.7 |
| Example A3 | 0.119 | 3.0 | 3.7 |
| Example A4 | 0.105 | 3.0 | 3.6 |
| Example A5 | 0.053 | 3.0 | 4.0 |
| Comparative Example A4 | 0.021 | 3.0 | 7.2 |
| Comparative Example A1 | 0.035 | 3.0 | 7.2 |
| Comparative Example A3 | — | 3.0 | 7.4 |

As shown in Table 2, Comparative Example A3, containing no aluminum salt and had a C2/C1 of 0, was confirmed to exhibit significant rise at in-polishing pH relative to initial pH. By contrast, all of Examples A1 to A5, having a C2/C1 of 0.04 or more, exhibited small rise at in-polishing pH relative to initial pH. Comparative Example A1, containing an aluminum salt but had a C2/C1 of less than 0.04, exhibited a tendency to slightly reduce rise at in-polishing pH relative to Comparative Example A3, but the effect was not sufficient.

In addition, the polishing composition in Comparative Example A4 was prepared by changing the concentration of an aluminum salt in Example A5 to 4 mM so as to have a C2/C1 of 0.021, and then this polishing composition according to Comparative Example A4 (initial pH 3.0) was used to measure an in-polishing pH in the same manner, and consequently confirmed to exhibit an in-polishing pH as much as that in Comparative Example A1, and a smaller effect to reduce rise in in-polishing pH with a C2/C1 of less than 0.04.

Experimental Example 2

<Preparation of Polishing Composition>

Example B1

A silica abrasive, potassium permanganate, aluminum nitrate, and deionized water were mixed to prepare a polishing composition containing each component with the following concentration: 0.1% silica abrasive, 189.8 mM potassium permanganate (calculated based on Mn), and 30.1 mM aluminum nitrate (calculated based on Al).

Examples B2 to B3 and Comparative Example B1

Each polishing composition according to a corresponding example was prepared in the same manner as in Example B1, except for changing the concentrations of a silica abrasive, potassium permanganate, and aluminum nitrate as shown in Table 3.

Comparative Example B2

A polishing composition according to Comparative Example B2 was prepared in the same manner as in Example B1, except for not using aluminum nitrate.

In each polishing composition according to a corresponding example in Experimental Example 2, colloidal silica with an average primary particle diameter of 35 nm were used as a silica abrasive. Each polishing composition according to a corresponding example was adjusted to pH 3.0 using nitric acid.

<Polishing of Object to be Polished>

A SiC wafer was preliminarily polished using a preliminary polishing composition including an alumina abrasive. The preliminarily polished SiC wafer was set as an object to be polished, and polished under the same polishing conditions as in Experimental Example 1, using directly each polishing composition according to a corresponding example as a polishing slurry.

<Measurement and Evaluation>

(Polishing Removal Rate)

A value derived by measurement in the same manner as in Experimental Example 1 was converted to a relative value to the value in Comparative Example B2 as 100, and shown in Table 3.

(Pad Temperature)

The value thus obtained in the same manner as in Experimental Example 1 was substituted into the following formula: ΔT [° C.]=(pad temperature in Comparative Example B2)−(pad temperature in each example); on the basis of the ΔT (i.e., reduction in pad temperature relative to pad temperature in Comparative Example B2), an effect to reduce increase in pad was evaluated according to the following three grades and shown in Table 3.

A: having a ΔT of more than 0.6° C.
B: having a ΔT of more than 0.3° C. to 0.6° C. or less.
C: having a ΔT of 0.3° C. or less.

(Preservation Stability)

Preservation stability was measured by a 60° C. accelerated test in the same manner as in Experimental Example 1. The results are shown in Table 3.

(In-Polishing pH)

Measurement was performed in the same manner as in Experimental Example 1. The results are shown in Table 4.

TABLE 3

|  | Silica abrasive content W1 [wt %] | Permanganate concentration C1 [mM] | Aluminum salt concentration C2 [mM] | C1/W1 | C1/√W1 | C2/C1 | Polishing removal rate (relative value) | Reduction of increase in pad temperature | Storage life in 60°C accelerated test [day] |
|---|---|---|---|---|---|---|---|---|---|
| Example B1 | 0.1 | 189.8 | 30.1 | 1898 | 600 | 0.159 | 253 | A | 47 |
| Example B2 | 0.1 | 189.8 | 20.0 | 1898 | 600 | 0.105 | 302 | A | 33 |
| Example B3 | 0.1 | 189.8 | 10.1 | 1898 | 600 | 0.053 | 294 | A | 20 |
| Comparative Example B1 | 0.1 | 189.8 | 4.0 | 1898 | 600 | 0.021 | 214 | C | 12 |
| Comparative Example B2 | 0.1 | 189.8 | 0.0 | 1898 | 600 | — | 100 | C | 7 |

TABLE 4

|  | C2/C1 | Initial pH | In-polishing pH |
|---|---|---|---|
| Example B1 | 0.159 | 3.0 | 3.7 |
| Example B2 | 0.105 | 3.0 | 3.8 |
| Example B3 | 0.053 | 3.0 | 3.8 |
| Comparative Example B1 | 0.021 | 3.0 | 7.2 |
| Comparative Example B2 | — | 3.0 | 7.4 |

As shown in Table 3, the polishing compositions in Examples B1 to B3, having a C1/W1 of 500 or more and/or a C1/√(W1) of 200 or more, and a C2/C1 of 0.04 or more, significantly improved a polishing removal rate as well as provided an effect to reduce increase in pad temperature relative to the polishing compositions in Comparative Example B2, which contained no aluminum salt. Meanwhile, Comparative Example B1, containing an aluminum salt but having small C2/C1, exhibited a small effect to reduce increase in pad temperature. In addition, Examples B1 to B3, having a high concentration of an aluminum salt, had longer-tem) preservation stability relative to Comparative Examples B1 and B2, which contained a low concentration of or no aluminum salt. Furthermore, as shown in Table 4, while Comparative Examples B1 and B2, having a C2/C1 of 0 or less than 0.04, exhibited significant rise at in-polishing pH relative to initial pH, Examples B1 to B3, having a C2/C1 of 0.04 or more, were effectively reduced in rise in in-polishing pH.

Preparation of Experimental Example 3

<Preparation of Polishing Composition>
The polishing compositions according to Example A3 and Comparative Example A3 in Experimental Example 1, and the polishing compositions according to Example B1 and Comparative Example B2 in Experimental Example 2 were prepared.
<Polishing of Object to be Polished>
A SiC wafer was preliminarily polished using a preliminary polishing composition including an alumina abrasive. The preliminarily polished SiC wafer was set as an object to be polished, and polished under the following two kinds of polishing conditions using directly each polishing composition according to a corresponding example as a polishing slurry.
[Polishing Condition 1]
Polishing machine: model "RDP-500" (platen diameter: 20 inches), manufactured by Fujikoshi Machinery Corp.
Polishing pad: "IC-1000" (rigid polyurethane type) manufactured by Nitta Haas Incorporated (present Nitta Dupont Incorporated).
Processing pressure: 29.4 kPa.
Platen rotational speed: 100 revolutions/min.
Head rotational speed: 100 revolutions/min.
Supply rate of polishing slurry: 20 mL/min.
Method of using polishing slurry: one-way.
Polishing time: 15 mins.
Object to be polished: 4-inch semi-insulating SiC wafer (conduction type: non-doped-type, crystalline type: 4H-SiC, off angle to the C-axis of the main surface (0001):0°), 1 sheet/batch.
Temperature of polishing slurry: 23° C.
[Polishing Condition 2]
Polishing machine: model "RDP-500" (platen diameter: 20 inches), manufactured by Fujikoshi Machinery Corp.
Polishing pad: "IC-1000" (rigid polyurethane type) manufactured by Nitta Haas Incorporated (present Nitta Dupont Incorporated).
Processing pressure: 39.2 kPa.
Platen rotational speed: 120 revolutions/min.
Head rotational speed: 120 revolutions/min.
Supply rate of polishing slurry: 20 mL/min.
Method of using polishing slurry: one-way.
Polishing time: 15 mins.
Object to be polished: 4-inch semi-insulating SiC wafer (conduction type: non-doped-type, crystalline type: 4H-SiC, off angle to the C-axis of the main surface (0001):0°), 1 sheet/batch.
Temperature of polishing slurry: 23° C.
<Measurement and Evaluation>
(Polishing Removal Rate)
After the SiC wafer was polished under the aforementioned polishing condition using each polishing composition of a corresponding example, a polishing removal rate was calculated according to the following calculation formulae (1) and (2):

$$\text{polishing allowance [cm]} = \text{difference between weight of SiC wafer before and after polishing [g]} / \text{density of SiC [g/cm}^3\text{]}(=3.21 \text{ g/cm}^3)/\text{area to be polished [cm}^2\text{]}(=78.54 \text{ cm}^2) \quad (1)$$

$$\text{polishing removal rate [nm/h]} = \text{polishing allowance [cm]} \times 10^7 / \text{polishing time}(=15/60 \text{ hours}). \quad (2)$$

The polishing removal rate thus obtained in Example A3 was converted to a relative value to the value in Comparative Example A3 as 100, and shown in Table 5. The polishing removal rate thus obtained in Example B1 was converted to a relative value to the value in Comparative Example B2 as 100, and shown in Table 6.

TABLE 5

|  | Polishing removal rate Polishing condition 1 (relative value) | Polishing removal rate Polishing condition 2 (relative value) |
|---|---|---|
| Example A3 | 155 | 162 |
| Comparative Example A3 | 100 | 100 |

TABLE 6

|  | Polishing removal rate Polishing condition 1 (relative value) | Polishing removal rate Polishing condition 2 (relative value) |
|---|---|---|
| Example B1 | 110 | 127 |
| Comparative Example B2 | 100 | 100 |

As shown in Tables 5 and 6, the polishing compositions in Example A3 and Example B1 provided an effect to improve a polishing removal rate relative to the polishing compositions in Comparative Example A3 and Comparative Example B2, which contained no aluminum salt, respectively, regardless of a polishing condition, even in polishing of a semi-insulating SiC wafer.

While specific examples of the present invention have been described above in detail, these are only illustrative, and do not limit the scope of the claims. The technologies recited in the claims include various modifications and alternations of the specific examples illustrated above.

The invention claimed is:

1. A polishing composition comprising:
an abrasive;
permanganate;
an aluminum salt; and
water,
wherein a relation of a content W1 [% by weight] of the abrasive, a concentration C1 [mM] of the permanganate, and a concentration C2 [mM] of the aluminum salt satisfies both of the following formulae (3) and (4):

$$200 \leq (C1/\sqrt{(W1)}) \quad (3); \text{ and}$$

$$8 \leq C2 \quad (4).$$

2. The polishing composition according to claim 1, wherein a relation of the concentration C1 [mM] of the permanganate and the concentration C2 [mM] of the aluminum salt satisfies the following formula (5):

$$0.04 \leq (C2/C1) \quad (5).$$

3. The polishing composition according to claim 1, wherein the content W1 of the abrasive is 0.005% by weight or more to less than 0.5% by weight.

4. The polishing composition according to claim 1, wherein a pH is 5.0 or lower.

5. The polishing composition according to claim 1, wherein the polishing composition is used for polishing a material having a Vickers hardness of 1500 Hv or more.

6. The polishing composition according to claim 1, wherein the polishing compositions is used for polishing an object of silicon carbide.

7. A polishing method comprising polishing an object to be polished using the polishing composition according to claim 1.

8. The polishing composition according to claim 1, wherein the abrasive is formed of oxide particles.

9. The polishing composition according to claim 1, wherein the abrasive is formed of silica particles.

10. The polishing composition according to claim 1, wherein the abrasive is formed of alumina particles.

11. The polishing composition according to claim 1, wherein the aluminum salt is a salt of an inorganic acid selected from the group consisting of hydrohalic acid, nitric acid, sulfuric acid, carbonic acid, silicic acid, boric acid, and phosphoric acid.

12. The polishing composition according to claim 1, wherein the aluminum salt is a salt of nitric acid.

13. The polishing composition according to claim 1, wherein a relation of the content W1 [% by weight] of the abrasive, the concentration C1 [mM] of the permanganate and the concentration C2 [mM] of the aluminum salt satisfies all of the following formulae:

$$347 \leq (C1/\sqrt{(W1)});$$

$$10.1 \leq C2;$$

$$0.053 \leq (C2/C1); \text{ and}$$

$$633 \leq (C1/W1).$$

* * * * *